United States Patent [19]

Anderson et al.

[11] 4,418,815

[45] Dec. 6, 1983

[54] NONMAGNETIC LEAD HANDLING SYSTEM

[75] Inventors: Gary W. Anderson, Transfer; Dennis G. Stake, Greenville, both of Pa.

[73] Assignee: Electronic Equipment Development Ltd., Toluca Lake, Calif.

[21] Appl. No.: 291,028

[22] Filed: Aug. 7, 1981

[51] Int. Cl.³ .............................................. B65G 47/84
[52] U.S. Cl. .................................... 198/476; 198/654; 198/656; 206/329
[58] Field of Search .............. 198/653, 654, 476, 655, 198/656, 688; 206/328, 329, 330

[56] References Cited

U.S. PATENT DOCUMENTS

| 2,988,199 | 6/1961 | Pinkham | 198/654 |
| 3,048,268 | 8/1962 | Rocchi et al. | 206/329 |
| 3,138,239 | 6/1964 | Ackerman et al. | 198/656 |
| 3,279,148 | 10/1966 | Henn | 206/329 |
| 3,596,486 | 8/1971 | Dolder | 206/330 |
| 3,738,315 | 6/1973 | Sweitzer | 198/656 |

FOREIGN PATENT DOCUMENTS 1526785 9/1978 United Kingdom ............... 206/329

*Primary Examiner*—Joseph E. Valenza
*Assistant Examiner*—Jonathan D. Holmes

*Attorney, Agent, or Firm*—Webb, Burden, Robinson & Webb

[57] ABSTRACT

A system for handling axial lead components comprises a flexible metal tape or molded plastic strip (to electrically test components while on strip), that has been especially perforated by die punching to have a plurality of sprocket receiving holes along its edges and a plurality of component receiving holes spaced centrally and along the length of the tape. The component holes have tabs at each lateral end thereof that define a component lead receiving slot. The slot has a predefined width at the end away from the tape. The slot width increases toward the base of the tabs. The predefined width of the slot at the end away from the tape is smaller than the diameter of the lead to be received in the slot. Only by flexing the tape to spread the tabs can a lead be inserted, freely rotated or removed from the slot. At least one tape flexing station is associated with each system. The tape flexing station comprises a cylindrical surface of sufficiently small radius of curvature at one position such that the tape pulled over the surface will be sufficiently flexed to spread the tabs to open the slots enabling a lead to be moved therein. Associated with every flexing station is at least one driving hold down that pulls the tape over the cylindrical surface and advances the tape by engaging the sprocket receiving holes.

14 Claims, 12 Drawing Figures

NONMAGNETIC LEAD HANDLING SYSTEM

BACKGROUND OF THE INVENTION

There exist a number of systems for handling axial lead components such as resistors and diodes. These systems take advantage of the paramagnetic properties of the components and/or the leads. Large permanent magnets are used to align the components and smaller permanent magnets are used to hold the components in selected positions. Magnetic lead handling systems are illustrated in U.S. Pat. Nos. 3,388,795; 3,537,580; 3,581,889; and 3,941,242. There also exist a number of systems for handling axial lead components on continuous conveyors having component receiving positions along the length thereof. The components are held at each conveyor position only by gravity thus limiting the attitude of the conveyor when loaded. See, for example, U.S. Pat. Nos. 3,382,574; 3,421,284; and 4,021,292. With these continuous conveyor systems, the alignment and spacing is only maintained so long as the components are positioned on the conveyor. There exists no capability of storing or transporting the components away from the apparatus without losing the alignment and spacing except by first transferring the components to adhesive tape at a reel packer. However, the only easy way of separating leads from the adhesive tape after reel packing is to cut the leads.

It is an advantage according to the invention to provide a system of handling nonmagnetic axial lead components in a way to establish and maintain alignment and spacing throughout processing.

It is a further advantage according to this invention to provide a system of handling axial lead components on a specially perforated metal tape that may be reeled with the components attached thereto to facilitate storage and transfer without losing alignment and spacing.

It is yet another advantage according to this invention to provide a system of handling axial lead components secured to a metal tape in a positive manner such that the tape may be placed in any position without the components falling away.

It is an advantage according to this invention to provide a unique perforated tape for handling axial lead components and a flexing station for flexing the tape to receive or release components.

SUMMARY OF THE INVENTION

Briefly, according to this invention, there is provided a system for handling nonmagnetic axial lead components. The system can, of course, be used to handle axial lead components that have paramagnetism within the components or their leads but does not make use of magnetism to align and maintain alignment and spacing of the components. By axial lead component is meant a compound that has lead wires extending from two opposite ends of the component with the lead wires being substantially aligned on the same axis.

An essential feature of this invention is a specially perforated metal tape or molded plastic strip. The tape can be perforated by sequential die punching to produce precisely spaced openings and tabs positioned along the length thereof. Preferably, the tape or strip has a plurality of square sprocket receiving holes along each edge. The sprocket holes may be provided on only one edge of the tape but it is preferable that the tape is symmetrical about its center line and has sprocket holes on both edges. The sprocket holes are used for optical indexing or gating the air operated component insertion device. They also provide the tape drive which can vary at an analog rate.

Component receiving holes are positioned centrally along the center line of the tape or strip and are spaced on center the same or a multiple or simple fraction of the spacing between the sprocket receiving holes. Preferably, the spacing is the same. The center line of the component openings extending transverse of the tape may be exactly one half the distance between the center lines through adjacent sprocket receiving holes. It is preferred that the tape be symmetrical about the transverse center line of any component hole. In this way, the tape can be run in either direction through various processing stations. The size of the component receiving holes is just larger than a section of the component taken along the outer edge of the leads, for example, the section of the component taken along the axis thereof. Larger holes are permissible but not necessary.

Tabs at each lateral end of the component openings are formed of metal that formerly was within the component hole. In the case of molded plastic strips, molded projections serve the function of the tabs. The tabs define a slot for receiving the leads of the axial lead components. The slots have a predefined entry width at the end away from the tape. The width of the slot increases from the predefined entry width to the base of the slot. The tabs may be chamfered toward the predefined entry width to the end away from the tape, say at 45 degrees to assist in guiding leads to the entry. Typically, the tabs are bent more than 90 degrees from the tape to assist in aligning the component body to reach its correct axial position relative to the component holes.

Because the entry width of the slots is less than the diameter of the leads of components to be handled by the tape, the leads cannot simply be dropped into the slots when the tape is lying flat. The tape must be flexed, that is bent to provide a curvature to the tape in the vicinity of the slot with the center of curvature being on the side of the tape opposite of the tabs. Sufficient flexing of the tape will spread the tabs and increase the entry width enough for the leads to drop into or be pushed into the slots. When the tape is the unflexed, the component is captured and held to the tape by its leads.

A system according to this invention will have at least one flexing station that comprises a cylindrical surface, preferably a roll, over which the tape can be pulled to flex it sufficiently to permit leads to be moved in the slot. The diameter of the flexing roll is critical and depends on the dimensions of the tape and the openings and tabs associated therewith.

The tape must be drawn over the flexing roll at a flexing station. The flexing station thus comprises two hold down devices and a device to advance the tape. One hold down device may comprise a guideway having a grooved shoe for riding over the tabbed side of the tape and a spring loaded shoe for riding over the other side of the tape. The grooves, of course, are longitudinal of the guideway and receive the tabs with adequate clearance. Thus the position of the tape is restrained as it is pulled through the guideway. This guideway can only be used as a hold down for an unloaded tape, i.e., a tape with no components mounted thereon. A combination hold down and capstan for advancing the tape, according to this invention, comprises two rolls journaled on parallel axes. The one roll, referred to as tape driving roll, has axially spaced sprockets for engaging the sprocket receiving holes of the tape and a central portion of reduced diameter. The other roll, referred to as the presser roll has a central portion of reduced diameter to provide clearance for the tabs and components. Near the axial ends, the presser roll has cylindrical ribs that have radial grooves therein to provide clearance for the leads of the components held on the tape. The axial length of the presser roll is just less than the distance between the sprockets on the drive roll. By driving both rolls from a common drive to synchronize them, the ribs of the presser roll step over the leads of the components held on the tape pressing the tape against the driving roll.

Thus, a flexing station may comprise a freely rotatably flexing roll and hold downs positioned on each side thereof. The hold downs are positioned to pull the tape down over the roll. Flexing stations may be located at different locations in an apparatus for processing axial lead components. For example, the first flexing station may be at a location where components are loaded onto the tape, then where the components are rolled and painted with coding strips and finally at a location where the components are removed from the metal tape, for example, at an adhesive tape reel packer.

THE DRAWINGS

Further features and other objects and advantages will become apparent from the following description of the preferred embodiment with reference to the drawings in which FIG. 1 is a front view of a lead straightener and axial lead handling system according to this invention;

DESCRIPTION OF THE PREFERRED EMBODIMENTS

Figure 1:
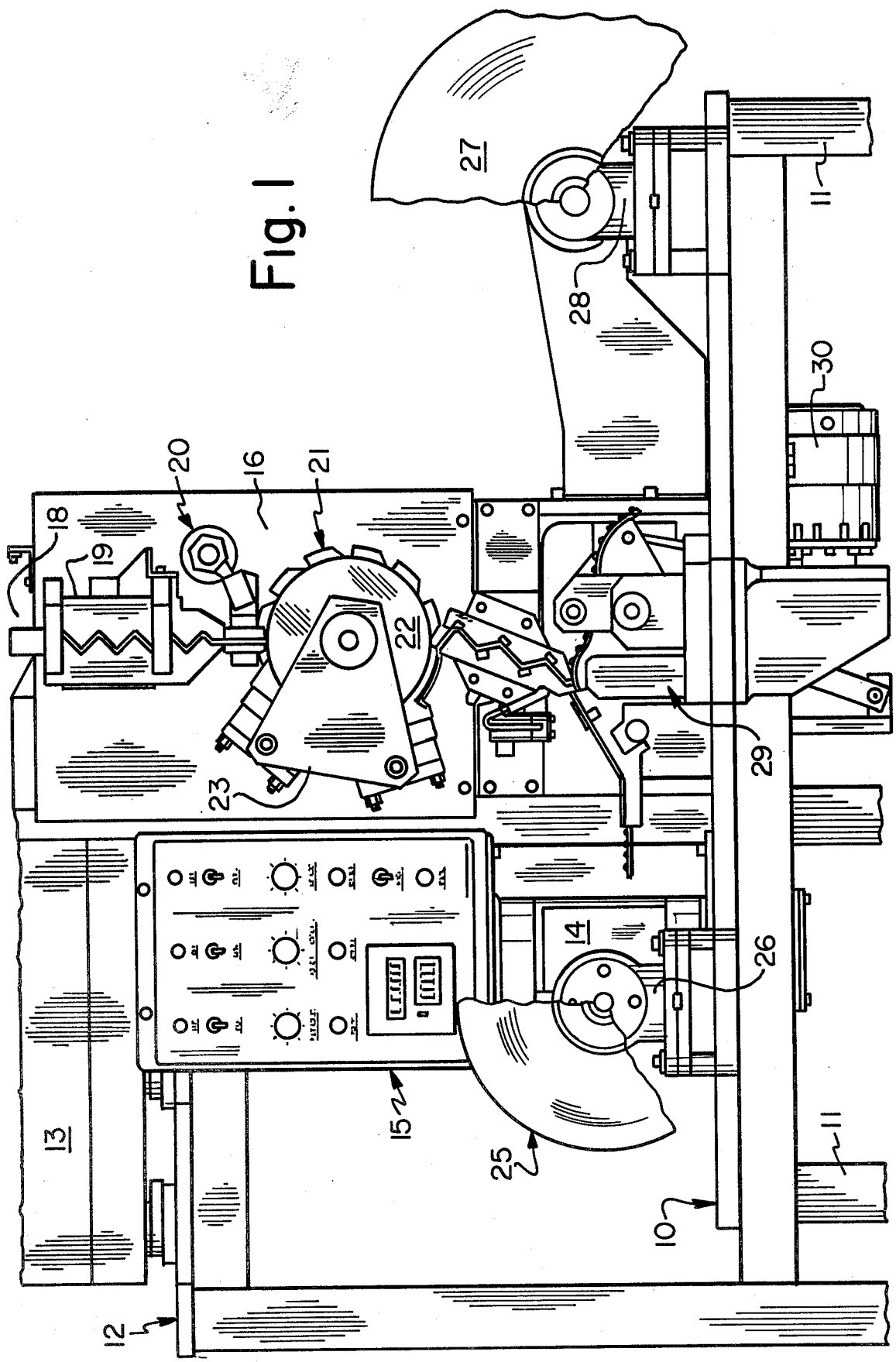
Figure 2:
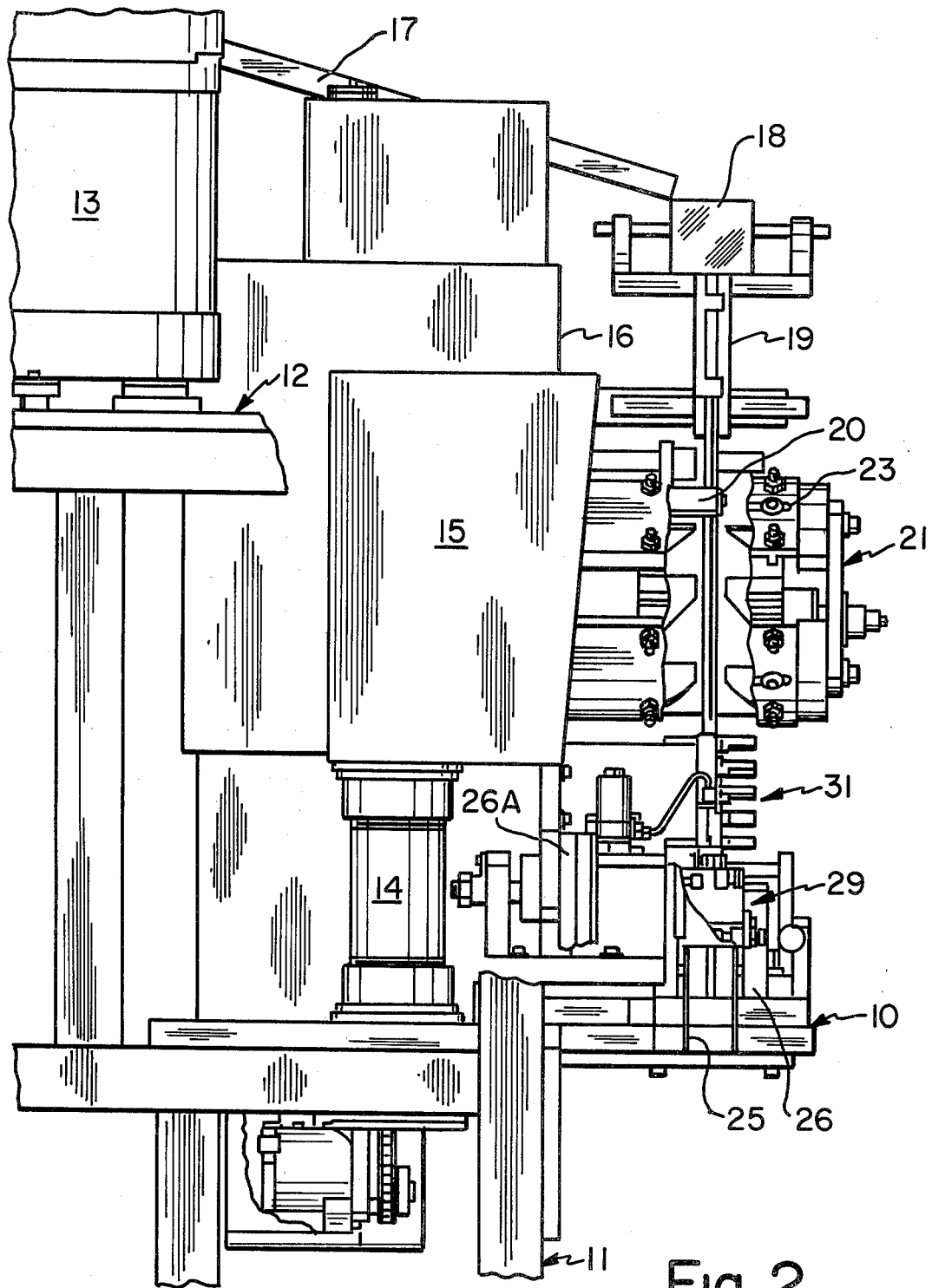
FIG. 2 is a left side view of the apparatus shown in FIG. 1.

Referring now to FIGS. 1 and 2, there is shown a nonmagnetic axial lead handling system in cooperation with a typical feed bowl and lead straightener. The system is supported on a table top 10 in turn supported by legs 11 above the floor at counter level. A shelf 12 is supported from the table for supporting the vibratory feed bowl 13. A standard 14 rises from the surface of the table to support a control box 15.

A support panel 16 is secured over the table on which the straightener assembly 21 is mounted. A chute 17 leads from the vibratory feeder to a hopper 18 near the top of the support panel 16. Thus axial lead components are delivered from the vibratory feeder to the hopper and at that point become aligned. The hopper feeds components to the upper zig-zag guide 19. The upper zig-zag has two photocells (not shown) associated therewith. An upper photocell senses a full zig-zag and shuts off the feed bowl. A lower photocell senses an empty zig-zag and shuts off the lead straightener. A gate mechanism 20 driven in synchronism with the lead straightener 21 intermittently passes components to the straightener. The straightener is of the well-known type in which the straightening roll 22 carries the component in a circular path and rolls the leads against a surround assembly 23.

On the left side of the table a pay-off reel 25 is releasably journaled in reel bearing standard 26. The pay-off reel may be provided with an adjustable slip clutch 26A to resist rotation of the reel sufficient to keep the tape paying off the reel taught. On the right side of the table a take-up reel 27 is releasably journaled in a second reel bearing standard 28. The take-up reel may be driven through an adjustable slip clutch so that the take-up reel always turns fast enough to reel up the tape no matter how full the reel. Between the two reels is a flex station 29 and tape loading assembly 31. Motor 30 mounted below the table drives the flex station and the take-up reel as will be explained. A separate motor (not shown) drives the straightener.

Figure 3:
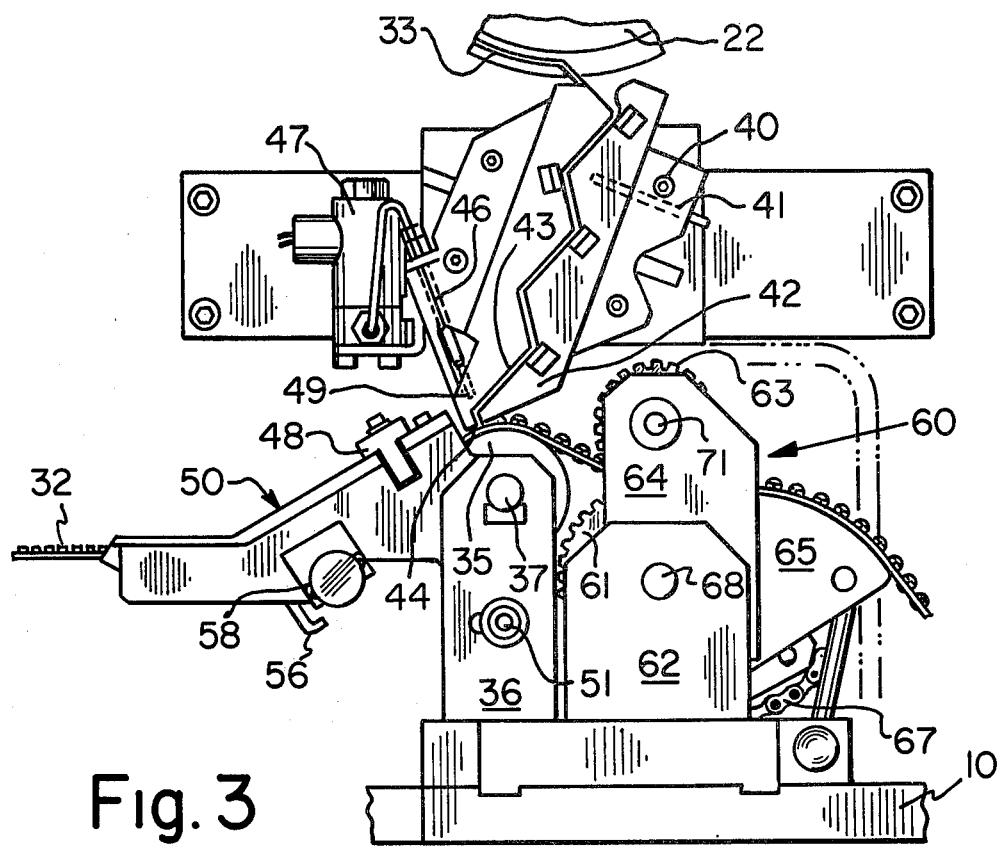
FIG. 3 is a front view of the flex station and component feed apparatus as shown in FIG. 1.

Referring now to FIG. 3, a tape loading assembly and the flexing station are shown standing alone. The flex roll 35 turns on shaft 37 journaled in standard 36. The flex roll is the main operative element in the flex station. For the tapes specifically described herein, the diameter of the flex roll 35 may typically be 1.5 inches. In the embodiment being described, the flex roll has roller bearings and is free to rotate upon its axis as it turns upon shaft 37. At an appropriate location over the flex roll, referred to as the entry point, an axial lead component can be moved into the tape 32. At the top of FIG. 3, the lowermost portion of the straightening roll 22 is shown. The components emerge from the straightener at this location and are delivered by rail 33 to the feed end of the lower zig-zag guide 40. The lower zig-zag has associated with it two photocells with associated light sources. The upper photocell 41 detects an over-full condition shutting down the straightener. The lower photocell 42 detects an almost empty zig-zag and shuts off the tape feed. The zig-zag has a long gently sloping slot 43 that joins a short steep slot 44 at the bottom of the zig-zag guideway. The two slots meet at a knee. The short slot 44 opens to the entry point over the flex roll 35.

An air piston assembly 46 has a piston that is aligned with the short slot 44 and is arranged to move within the slot. The piston 49 has a retracted position that clears the short slot 44 and an extended position at which its lower end approaches the entry point over the flex roll. The air piston assembly 46 is controlled by a solenoid operated valve 47. A signal that initiates the electrical activation of the solenoid operated valve 47 is derived from photocell 48 which is mounted to index upon the sprocket receiving holes is the tape 32. (The tape is described in more detail with reference to FIGS. 7, 8, and 9.) When the photocell 48 signals the correct position of the tape, the piston 49 moves down through the short slot 44 at the bottom of the zig-zag guide 40 and pushes a component out of the slot onto the tape.

Behind photocell 48 is another photocell which also "looks" at the tape. When none is present, it shuts the entire machine down.

Still referring to FIG. 3, to the left side of the flex roll 35 is a guideway hold down 50 and to the right side is roll hold down and capstan drive 60. The unloaded tape 32 enters the guideway hold down from the pay-out reel. The tape emerges from the guideway hold down below the top of the flex roll 35 and wraps over the flex roll. The tape then passes into the roll hold down and capstan 60 which has an entry point below the top of the flex roll. In this way, the tape is pulled down over the flex roll and is forced to conform its lower side to the flex roll.

The roll hold down 60 comprises two principal elements, namely the tape drive roll 61 on main shaft 68 journaled in bearing standard 62 and the presser roll 63 on shaft 71 journaled in bearing standard 64. The loaded tape is passed between the two rolls 61, 63 and exits over an adjustable exit guideway 65. A portion of a chain 67 is visible in FIG. 3. The chain is part of the synchronized drive mechanism for the two rolls.

A flex station according to this invention must have a cylindrical surface over which the tape is drawn to flex the tape. In the embodiment being described the cylindrical surface is the flex roll 35. Hold downs must be positioned on each side of the flex roll. The type of hold down depends on whether the tape is loaded or not as it passes through the hold down. Since the tape is being loaded at the flex station described herein, the hold down seen on the left is a simple guideway which can accomodate an unloaded tape. The hold down on the right is more complicated because it must receive a tape that is loaded and it must also supply the driving action to the tape.

Figure 4:
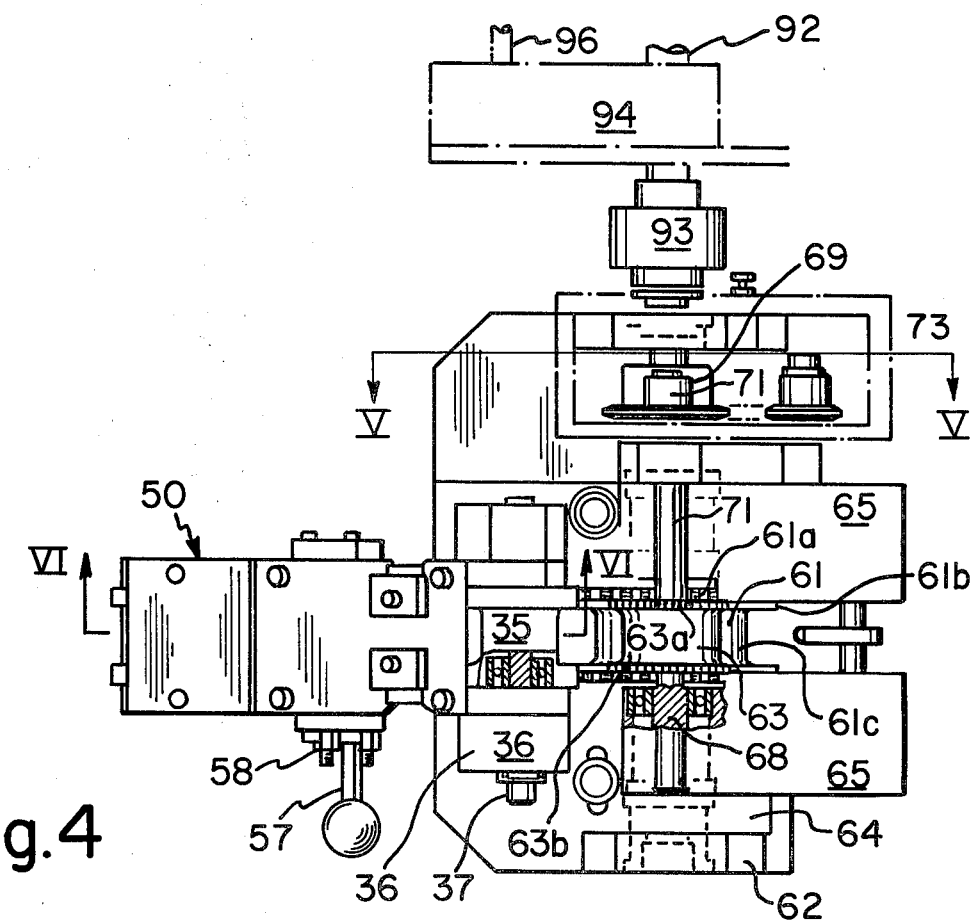
FIG. 4 is a plan view of the flex station shown in FIG. 3.

Referring now to FIG. 4, the configuration of the tape driving roll 61 and the presser roll 63 can be better understood. The tape driving roll has five axial sections. The axial end sections comprise sprocket wheels 61a that have teeth sized and spaced to engage the sprocket receiving openings along the edges of the tape. Axially inward of the sprocket wheels are pinch roll sections 61b that have a diameter the same as the diameter of the sprocket wheels at the bottom of the teeth. The bottom of the tape normally lies over the pinch roll section. The central section 61c of the driving roll has a smaller diameter than the adjacent pinch roll sections so that the components seated in the tape and extending below the tape clear the central portion.

The presser roll has three axial sections. The outer axial sections (cylindrical ribs) 63a are sized and spaced to roll over the pinch wheel sections 61b of the tape driving roll to pinch the tape therebetween. The outer sections of the presser roll have a plurality of radial grooves therein that give the outer sections (cylindrical ribs) the general appearance of gear teeth. The grooves span the leads of the axial lead components captured on the tape. The central section 63b of the presser roll is of a reduced diameter to provide clearance for the tabs extending up from the tape as well as the components seated thereon.

Figure 5:
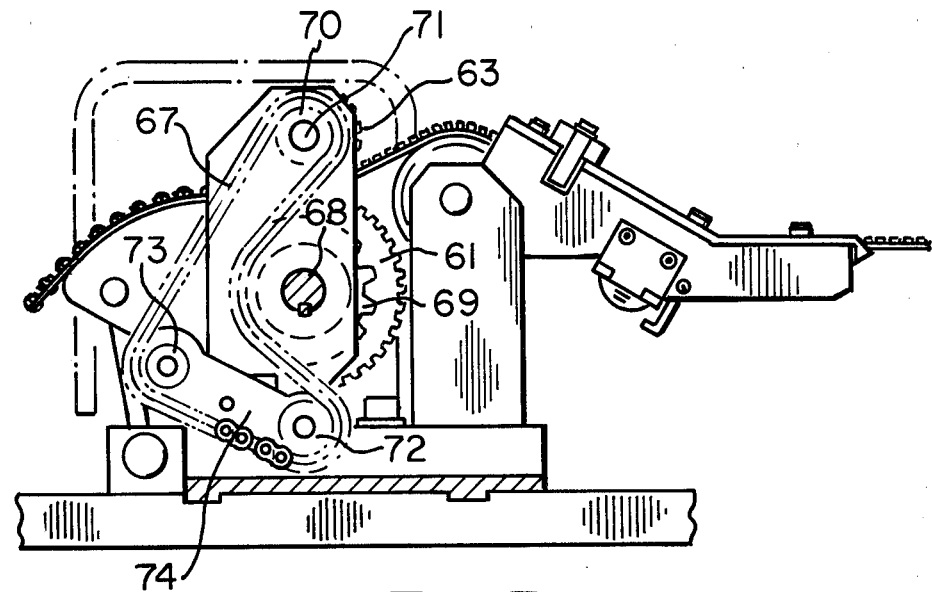
FIG. 5 is a back section of the station taken along lines V—V of FIG. 4.

To insure that the component leads will always align with the grooves in the presser roll, both the driving roll and presser roll are driven together in synchronism. The drive for the rolls is best understood from FIG. 5. The power input is upon the main shaft 68 which carries the drive roll 61 and the main timing sprocket 69. An upper drive sprocket 70 is secured to a shaft 71 which drives the presser rolls 63. Below the main timing sprocket is an idler srocket 72 and at one side is a tensioner 73 which is mounted on tensioner arm 74. The chain 67 is threaded over all sprockets 70, 72, 73 and along sprocket 69 such that the presser roll 63 is driven in an angular direction opposite the angular direction in which the drive roll is turned. As shown in FIG. 5, the drive roll turns counterclockwise and the presser roll turns clockwise. The ratio of the number of sprocket teeth on the main timing sprocket 61 to those on the upper drive sprocket 70 should be the same as the ratio of the tape engaging teeth on the drive roll 61 to the number of lead clearing slots in the cylindrical ribs 63a on the presser roll. In this way, the tape remains synchronized with the presser roll and the presser roll clears the leads of the components captured by the tape.

Figure 6:
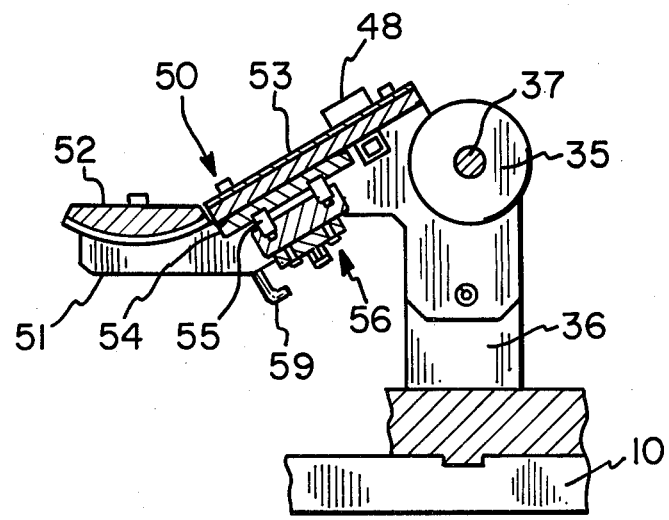
FIG. 6 is a front section of the guideway hold down taken along lines VI—VI of FIG. 4.

Referring now to FIG. 6, there is shown in section a guideway-type hold down 50 according to the invention. The guideway hold down is pivotally attached to the standard 36 for the flex roll 35, to rotate about the same axis that the flex roll turns upon specifically. Side rails 51 have bores that slide over the shaft 37 supporting the flex roll 35. The angular relation between the guideway hold down and the standard 36 can be varied somewhat and fixed by turning down a nut over stud extending from the standard through an arcuate slot in the standard (see FIG. 1). Spanning the rails 51 is entry shoe 52 that has a cylindrical bottom surface that loosely bears upon the top face of the tape at the edges of the tape (with a central slotway in the cylindrical surface to provide clearance for the tabs). Also spanning the side rails is a grooved guide plate 53. The grooved guide plate has a flat bottom surface with two longitudinal grooves to provide clearance for the longitudinally aligned tabs on each half of the tape. The flat surface bears upon the edges and the central portion of the top of the tape. A bottom shoe 54 is supported by springs 55 from adjustable support plate 56. The adjustable support plate is hinged on one side rail 51. The adjustable support plate has a handle 57 that engages a snap retainer 58 when in its upward position. By swinging the adjustable support plate down (pressing down upon the handle) the tape can be threaded into the guideway hold down. After the tape is in place in the guideway hold down, the handle can be lifted to engage the snap retainer. In this position, the bottom shoe 54 is pressed by springs 55 against the bottom of the tape. Arm 56 retricts the downwardmost swing of the adjustable support plate. The indexing photocell 48 (referred to above) is preferably mounted in the guideway hold down as shown. The timing of the action of the air piston assembly 58 can be adjusted by rotating the guideway and tightening down the nut on the stud extending through the arcuate slot in the standard.

Figure 7:
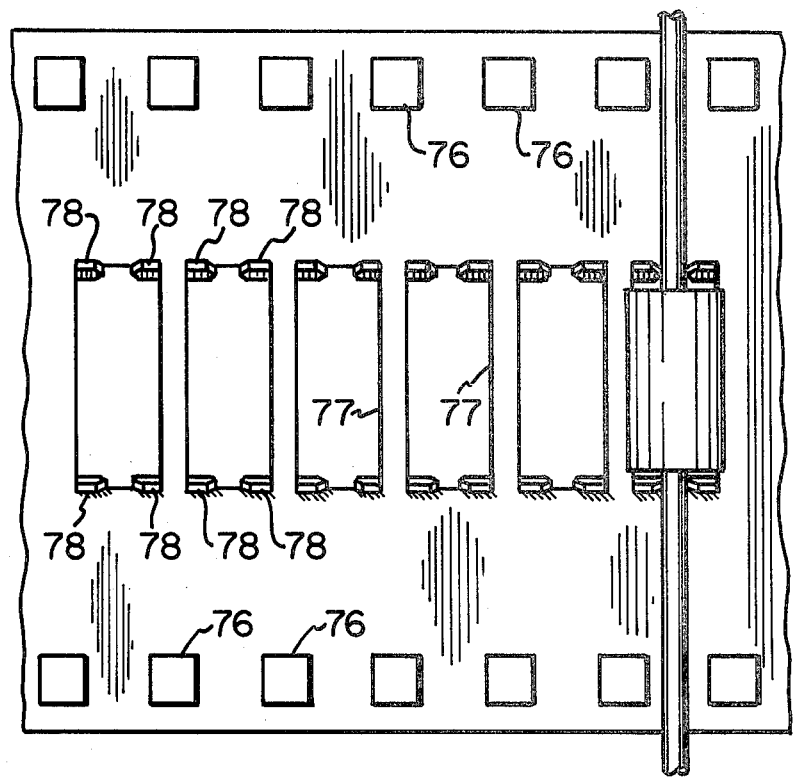
FIG. 7 is a plan view of a metal tape according to this invention.
Figure 8:
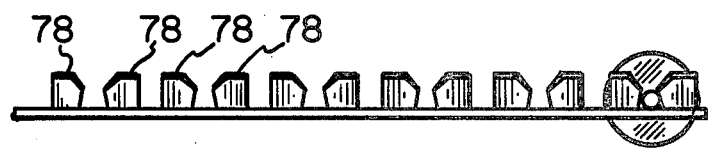
FIG. 8 is an edge view of a metal tape according to this invention.
Figure 9:
FIG. 9 is a lateral section of a metal tape according to this invention.

Referring now to FIGS. 7, 8, and 9, the tape 32 is manufactured by sequentially die punching a metal tape. The tape may, for example, comprise stainless steel or brass. The metal selected for the manufacture of the tape should be reasonably hard as the tabs thereon should not be easily distorted nor the tape easily wrinkled. On the other hand, the die punching process requires the tape not be too hard or the tabs will fracture during forming. Tape made of 0.008 inch thick 302 stainless steel has been found satisfactory.

The tape is defined by a plurality of repeating functional units. Each functional unit has structure to capture one axial lead component. Additionally, each unit has openings for receiving sprockets for advancing the tape. These openings are also useful for indexing the functional unit or some closely spaced functional unit with an apparatus through which the tape is being passed. The functional units are typically 0.200 inch wide along the tape for tapes designed to capture components having a body diameter of 0.150 inch or less and 0.400 inch wide for tapes designed for components having body diameters between 0.150 and 0.198 inches. Of course, the width of the functional units can be increased even more for larger components. The remaining exemplary dimensions are given for a tape having functional unit length of about 0.200 inch.

Referring to FIG. 7, a length of tape comprising a plurality of the above described functional units has square sprocket receiving holes 76 along each edge. The sprocket holes 76 are spaced, leading edge to leading edge, the distance being the length of a functional unit. The sprocket holes are square and in this embodiment 0.100 inch on a side. Each functional unit of the tape has a component receiving hole 77. The component receiving holes are positioned along the center line of the tape. In this embodiment, the holes are equally spaced on each side of the center line and between sprocket holes. In other words, from the center line of the preceding socket hole to the center line of the component receiving hole is a distance of 0.100 inch where the functional unit is 0.200 inch wide. The component receiving opening in this embodiment is approximately 0.360 inch long (in a direction transverse of the tape) and 0.150 inch wide (in a direction along the center line of the tape).

At each end of the component receiving hole 77 are tabs 78. The tabs are formed of metal that formerly was within the component receiving holes and the tabs are integral with the tape. The tabs define slots for receiving the leads of the axial lead components. The slots have a predefined entry width at the end away from the tape. The width of the slot increases from the predefined entry width to the base of the slot. For example, if the leads of the components to be handled had a nominal diameter of 0.041 inch, the predefined entry width would be between 0.038 and 0.039 inches. The slot would increase in width to between 0.043 and 0.044 at the base. The tabs may be chamfered, tapering toward the predefined entry width from the end away from the tape, say at 40 degrees to assist in guiding leads to the entry. Typically the tabs are bent more than 90 degrees (see FIG. 9) from the tape to assist in guiding the component body to reach its correct axial position relative to the component holes.

Figure 10:
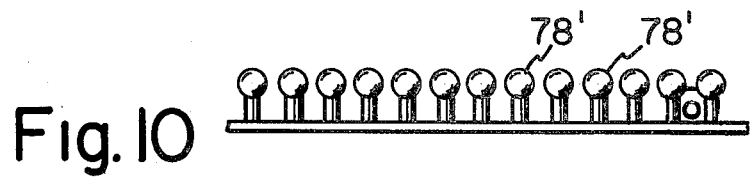
FIG. 10 is an edge view of a molded plastic strip according to this invention.
Figure 11:
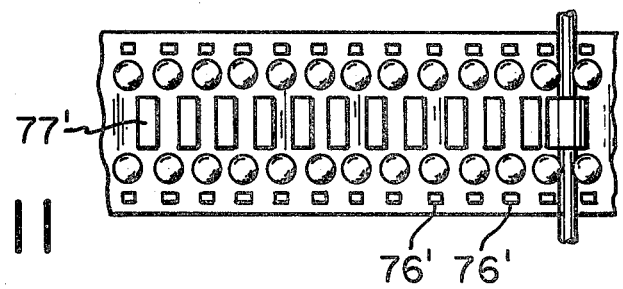
FIG. 11 is a plan view of a molded plastic strip according to this invention.

In some applications of this invention, it is necessary to electrically test components while held upon the tape by applying a voltage across the leads thereof. Hence, the leads cannot be shorted together as they would be by use of the metal tape described with reference to FIGS. 7, 8, and 9. For the aplications requiring electrical testing, a continuously molded plastic tape may be used. Plastics are nonconductive (suitable plastics are already continuously molded for use as plastic zippers). Referring to FIGS. 10 and 11, there is illustrated a molded plastic strip with component receiving holes 77', sprocket receiving holes 76' and projections 78' that serve the same basic function as the metal tabs 78 on the metal tapes already described.

Figure 12:
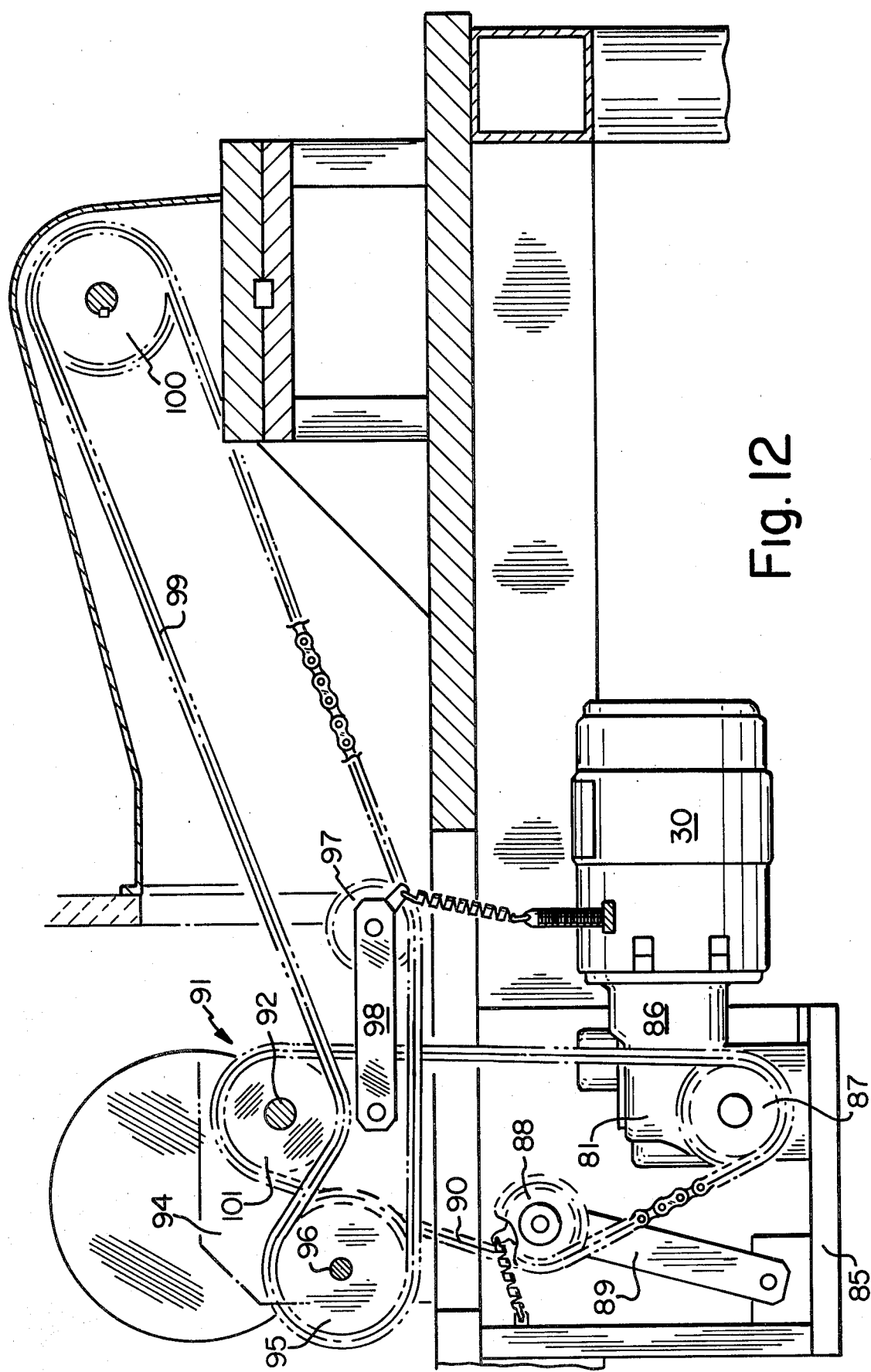
FIG. 12 is a partial section showing the motor and chain drives for the flex station and take-up reel.

Referring now to FIG. 12, the drive for the flexing station and take-up wheels 27 is shown. Motor 30 is mounted bwelow the table top 10 on a motor support housing 85. The motor is directly connected to a gear transmission 81 that drives transmission sprocket 87. A tensioner sprocket 88 is mounted on tensioner arm 89. Chain 90 wraps the transmission sprocket 88, the tensioner sprocket 89 and the main drive sprocket 91. The main drive sprocket 91 drives shaft 92 which is journaled in retaining block 94 and is coupled by coupling 93 (see FIG. 4) to the main shaft 68 of the flexing station.

Mounted to the retaining block 94 axially spaced from the shaft 92 is an idler sprocket 95 turning on shaft 96. A reel drive sprocket 101 is mounted on the same shaft 92 as the main driven sprocket 91. A tensioner sprocket 97 is mounted on arm 98 which is pivotally mounted to the retaining block 94. Chain 99 wraps the idler sprocket 95, the tensioner sprocket 97 as well as sprocket 100 which is secured to a shaft for driving the take-up reel. The outside of chain 99 engages reel drive sprocket 101 so that the take-up reel 27 is driven counterclockwise when the drive roll 61 engaging a tape is driven clockwise (as viewed in FIG. 12). Thus the tape is carried over the drive roll 61 and wraps under the reel 27 (see FIG. 1).

OPERATION

A tape 32 is played off of pay-off reel 25 and is threaded through guideway hold down 50, over flex roll 35 and through roll hold down and capstan drive 60 and thence onto take-up reel 27. The guideway hold down is adjusted so that the photocell 48 generates a signal just as a component opening 77 on the tape is below short slot 44 in the lower zig-zag guideway. At this location, the tape is flexed to spread the tabs 78. When the component opening is below the short slot 44 the piston moves forward forcing a component to be seated on the tape.

The power to the electrically driven elements of the system, for example, the tape and reel drive motor 30, the lead straightener motor and the vibratory feeder may all be conveniently controlled (on/off and speed) at the control panel (see FIG. 1).

Other systems according to this invention may include tape, flex stations, and hold downs between the same reels or between other sets of pay-off and take-up reels. These systems might, for example, include a painting station or reel packer. The tape might be loaded on one system such as shown in FIG. 1 and then the loaded reel moved to another system. In that case, the loaded tape is placed upon a pay-off reel and fed to a flex station, say part of a painting station, through a roller type hold down and capstan 60. Note that because the tape is symmetrical about its center line and the lateral center line of any component receiving hole, the tape can be fed in either direction through the capstan 60.

Having thus described the invention with the detail and particularity required by the Patent Laws, what is desired protected by Letters Patent is set forth in the following claims.

We claim:
1. A tape for receiving axial lead components comprising an elongate strip of flexible metal tape successively die punched to provide a plurality of sprocket receiving holes along each edge, a plurality of component receiving holes spaced along the center line of the tape, bounded by spaced pairs of tabs rising from a base only at each lateral end of the component receiving holes, each opposed end pair of tabs defining therebetween an open slot extending to the base of the tabs, said slot being narrower at the top than at the base.

2. The tape according to claim 1 in which the sprocket receiving holes are equally spaced a given distance along each edge and sprocket receiving holes on opposite edges are laterally aligned and the component receiving holes are spaced apart the given distance.

3. The tape according to claim 2 in which the component receiving holes have a lateral axis of symmetry that bisects the space between sprocket receiving holes.

4. A tape according to claims 1, 2, or 3, in which the tape is symmetrical about the lateral axis of any component receiving hole and the elongate center line of the tape whereby the tape presents the same appearance to an apparatus through which it is being processed in either direction.

5. A system of handling axial lead components having a component body with two leads extending therefrom in opposite directions comprising:
   a metal tape having equally spaced openings for receiving sprocket teeth and equally spaced component openings centrally spaced along said tape, said component openings having a pair of tabs extending from a base only at each lateral end of said component openings, each said pair of tabs defining therebetween an open plot extending to the base of the tabs, said slot being narrower at the end away from the tape and spaced apart a predefined distance when the tape in the vicinity of the slots is substantially flat, said predefined distance being less than the nominal diameter of the component leads,
   means for flexing the tape to temporarily spread the tabs, and
   means for manipulating an axial lead component having its lead positioned in slots upon the tape when the tape is flexed.

6. A system according to claim 5 further comprising a light source and photocell indexed upon the tape openings for receiving sprocket teeth, said photocell for generating a signal to actuate the manipulating means in synchronism with the passage of the component openings in the tape.

7. A system according to claim 5 wherein the manipulating means loads axial lead components onto the tape.

8. A system according to claim 5 wherein the means for flexing the tape comprises a flex roll and adjacent means for holding the tape flexed over the roll.

9. A system according to claim 8 in which the flex roll rotates upon its axis.

10. A system according to claim 9 wherein at least one means for holding comprises two rolls between which the tape passes one of said rolls having sprockets for engaging the sprocket receiving holes on the tape.

11. A system according to claim 10 wherein both said rolls have a central axial section of reduced diameter, said axial sections being at least as wide as the component openings upon the metal tape.

12. A system according to claim 11 wherein the roll which bears upon the component carrying side of the metal tape has a plurality of axial grooves for clearing the leads of the components carried by the tape.

13. A system according to claim 8 wherein one of the means for holding comprises two facing shoes biased together with longitudinal grooves in one shoe to provide clearance for the tabs extending from the tape sliding between said shoes.

14. A system according to claim 8 wherein said flex roll has a central axial section of reduced diameter, said axial section being at least as wide as the component openings upon the metal tape.

* * * * *

UNITED STATES PATENT AND TRADEMARK OFFICE
CERTIFICATE OF CORRECTION

PATENT NO. : 4,418,815

DATED : December 6, 1983

INVENTOR(S) : Gary W. Anderson et al.

It is certified that error appears in the above-identified patent and that said Letters Patent are hereby corrected as shown below:

Column 1 Line 56 "compound" should read --component--.

Column 7 Line 56 "aplications" should read --applications--.

Column 7 Line 67 "bwelow" should read --below--.

Claim 5 - Column 9 Line 24 "plot" should read --slot--.

Signed and Sealed this

Tenth Day of April 1984

[SEAL]

Attest:

GERALD J. MOSSINGHOFF

Attesting Officer     Commissioner of Patents and Trademarks